United States Patent [19]

Bergonzoni

[11] Patent Number: 4,968,639

[45] Date of Patent: Nov. 6, 1990

[54] PROCESS FOR MANUFACTURING CMOS INTEGRATED DEVICES WITH REDUCED GATE LENGTHS

[75] Inventor: Carlo Bergonzoni, Arcore, Italy

[73] Assignee: SGS-Thomson Microelectronics S.r.l., Agrate Brianza, Italy

[21] Appl. No.: 284,272

[22] Filed: Dec. 14, 1988

[30] Foreign Application Priority Data

Dec. 21, 1987 [IT] Italy ............................. 23134 A/87

[51] Int. Cl.⁵ ..................................... H01L 21/336
[52] U.S. Cl. ..................................... 437/57; 437/58;
437/44; 437/45; 437/150; 357/23.8
[58] Field of Search ................ 437/56, 57, 58, 59,
437/44, 45, 34, 41, 150, 151, 152, 153, 154;
357/23.3, 23.8

[56] References Cited

U.S. PATENT DOCUMENTS

| 4,306,916 | 12/1981 | Wollesen et al. | 437/34 |
| 4,385,947 | 5/1983 | Halfacre et al. | 437/34 |
| 4,420,344 | 12/1983 | Davies et al. | 437/34 |
| 4,642,878 | 2/1987 | Maeda | 437/44 |
| 4,764,477 | 8/1988 | Chang et al. | 437/44 |

FOREIGN PATENT DOCUMENTS 8808202 10/1988 World Int. Prop. O. ......... 357/23.3

OTHER PUBLICATIONS

"Self-Aligned P+ Implanted Regions...," IBM Technical Disclosure Bulletin, vol. 31, No. 4, Sep. 1988, pp. 421-423.

Primary Examiner—Brian E. Hearn
Assistant Examiner—T. N. Quach
Attorney, Agent, or Firm—Guido Modiano; Albert Josif

[57] ABSTRACT

A process for manufacturing CMOS integrated devices with gate lengths of less than one micron and high supply voltage is described. In order to improve the resistance of CMOS devices to breakdown and punch-through phenomena without cost increases with respect to conventional CMOS processes and limiting as much as possible the introduction of resistances in series to the transistors, less doped source and drain regions being provided in only one of the two MOS transistors, e.g. in the N-channel transistor, to increase the breakdown voltage, an oppositely doped region, e.g. with P-type doping, being provided around the source and drain regions of this first transistor to protect this first transistor against punch-through, and doped wells being provided around the source and drain regions of the complementary transistor, which is e.g. a P-channel transistor; the doped wells being oppositely doped with respect to the source and drain regions but having a lower doping level than the region of the body of semiconductor material which accommodates the complementary transistor, in order to increase the breakdown voltage of the P-channel complementary transistor.

7 Claims, 2 Drawing Sheets

PROCESS FOR MANUFACTURING CMOS INTEGRATED DEVICES WITH REDUCED GATE LENGTHS

BACKGROUND OF THE INVENTION

The present invention relates to a process for manufacturing CMOS integrated devices with a reduced gate length.

In particular, the process relates to high voltage fed CMOS integrated devices with gate lengths of less than one micron.

It is known that the punch-through and breakdown of the junction are important limiting factors in reducing the dimensions of devices, since the high doping of the channel required to avoid punch-through can lead to an early breakdown of the junction, due to the increase of the electric field at the junction.

Manufacturing methods are currently known, such as the Lightly Doped Drain (LDD) method, which have the purpose of controlling and reducing the maximum electric field peak. According to these methods, a light implanting of ion species adapted to generate regions with the same type of conductivity as the source and drain regions of the transistor to be manufactured is first performed by means of two successive separate masks. Silicon oxide spacer structures are then generally formed at the sides of the gate regions of the transistors to mask a heavy ion implanting of said source and drain regions. Forming these LDD regions in N-channel transistors and in P-channel transistors, however, is entailing some disadvantages, since in any case it produces a worsening of the electric characteristics of the device, especially of its speed, due to the resistances which are introduced in series to the source and drain regions of the transistors and thus reducing the value of the current flowing through the transistor. This known LDD process furthermore entails a hardly negligible cost increase with respect to conventional CMOS processes, due to the two masks required to produce the individual LDD regions in the two transistors.

SUMMARY OF THE INVENTION

Given this situation, the aim of the present invention is to provide a process for manufacturing CMOS integrated devices with reduced gate lengths, capable of obviating the disadvantages of the known art, and in particular of providing a protection against breakdown and punch-through phenomena with no substantial increase in the number of manufacturing steps of conventional CMOS processes, and more precisely without increasing the number of required masking steps.

Within the scope of this aim, a particular object of the present invention is to provide a manufacturing process which is capable of limiting as much as possible the introduction of resistances in series to the transistors, so as to limit the worsening of the electric characteristics of the CMOS devices with respect to conventional processes.

Not least object of the present invention is to provide a process which comprises per se known and used process steps, so as to allow the use of machines which are commonly employed in the electronics industry, with thoroughly controllable procedures and results.

This aim, the objects mentioned and others which will become apparent hereinafter are achieved by a process for manufacturing CMOS integrated devices with reduced gate lengths as described in the appended claims.

BRIEF DESCRIPTION OF THE DRAWINGS

The characteristics and advantages of the invention will become apparent from the description of a preferred but not exclusive embodiment, illustrated only by way of nonlimitative example in the accompanying drawings, wherein.

DESCRIPTION OF THE PREFERRED EMBODIMENTS

Figure 1:
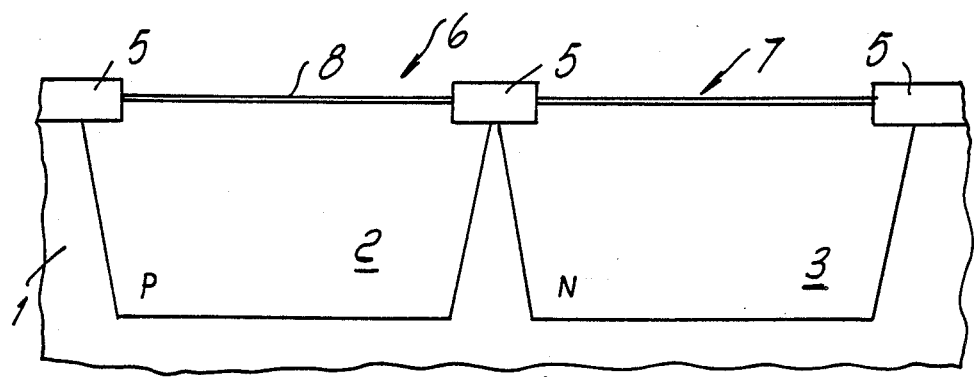
FIGS. 1 to 6 are transverse sectional views taken through a silicon wafer, illustrating different successive steps of the process according to the invention.
Figure 2:
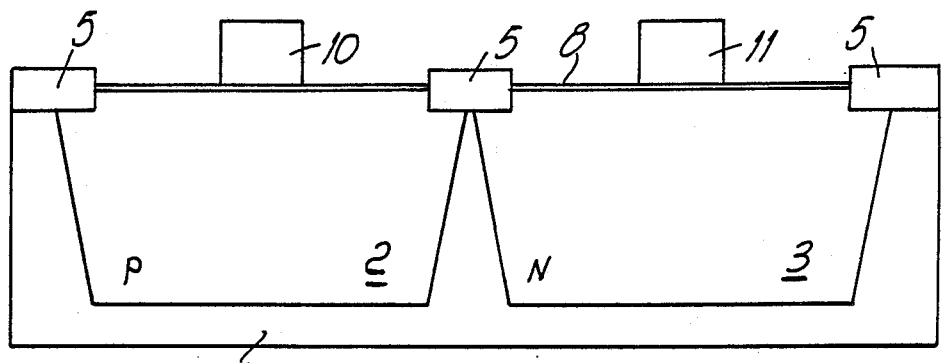

The process according to the invention initially comprises conventional steps to obtain oppositely doped regions in a body or substrate of semiconductor material 1 to provide the complementary transistors. In the illustrated embodiment, wells or first substrate regions 2 with P-type conductivity and wells or second substrate regions 3 with N-type conductivity are diffused in the monocrystalline silicon substrate 1 by means of conventional methods. Then the active areas are defined by forming insulating oxide regions 5 which separate the individual active areas; in FIG. 1 the reference numeral 6 indicates the active area intended to accommodate the N-channel transistor, while 7 indicates the active area intended to accommodate the P-channel transistor. Then a gate oxide layer, indicated by the reference numeral 8 in FIG. 1, is grown by conventional methods on the surface of the wafer of semiconductor material. Consequently the gate regions of the individual transistors are formed, by conventional methods, again by depositing, doping and shaping a layer of polycrystalline silicon. The structure illustrated in FIG. 2 is thus obtained; in this figure, the reference numeral 10 indicates the gate region of the N-channel transistor which is to be accommodated in the P-well or first substrate regions 2, and the reference numeral 11 indicates the gate region of the complementary P-channel transistor which is to be accommodated in the N-well or second substrate region 3.

According to the invention, in order to obtain wells for protecting the individual transistors of CMOS devices against punch-through and breakdown, a light implanting with a P-type ion species is then performed on the entire substrate (blanket implant). This implanting is indicated in the figure by the arrows 12, and is leading to the accumulation of the implanted ions in the not shielded substrate regions. The shielded regions include the insulations 5 and the gate regions 10 and 11. Said ions are consequently diffused by means of an appropriate thermal treatment. First well regions 13 consequently form in the P-type substrate region 2, said regions having also P-type conductivity but being more heavily doped; second well regions 14 form in the N-type substrate region, and the concentration of the doping agent of said well substrate region is partially compensated in these regions. The second well regions 14 with N− type conductivity thus form inside the well substrate region 3.

Figure 4:
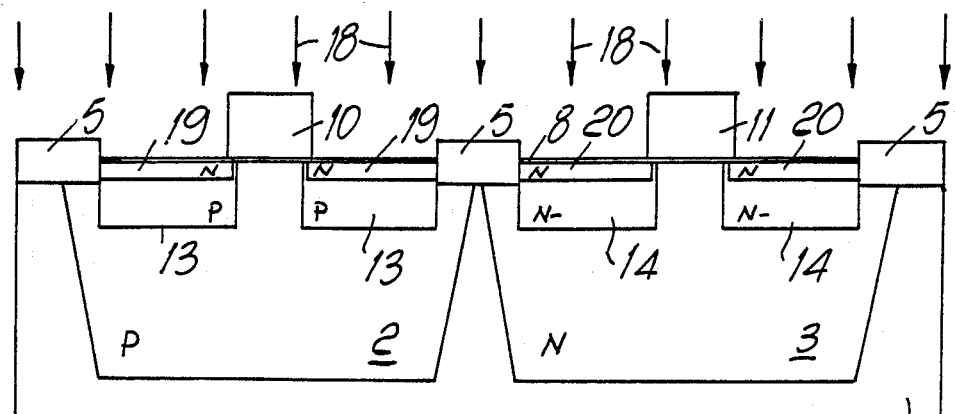

Further, according to the invention, an N implanting is performed on the entire substrate (blanket implant) to form LDD regions. This step is shown in FIG. 4, in which the arrows 18 indicate the N implanting causing N-type surface regions 19 to form inside the well region 13, and intermediate surface regions 20, also of the N type, to form inside the regions 14.

Figure 5:
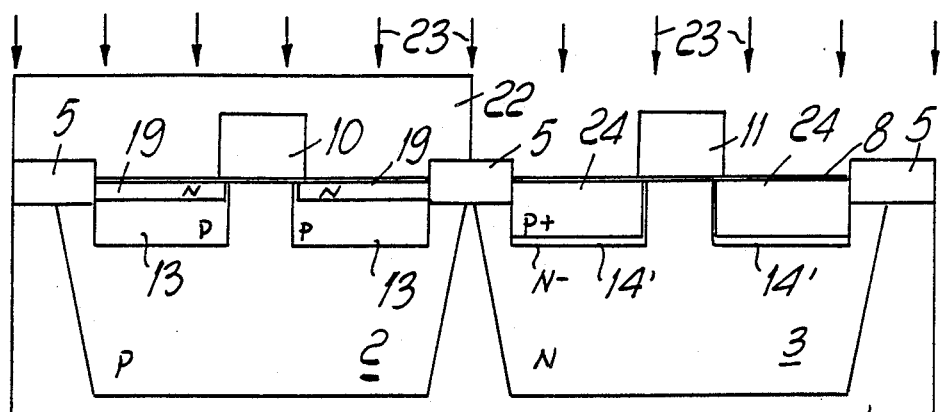

Then the P+ junctions are implanted; said junctions being intended to form the source and drain regions of the P-channel transistor provided in the N well. This step is shown in FIG. 5, which illustrates the resist mask 22 covering the regions which must not be implanted, such as e.g. the areas of the substrate which are to accommodate the N-channel transistors. In the figure, the arrows 23 indicate the P-type implanting (performed e.g. with boron) for forming the source and drain regions 24 of the P-channel transistor. It should be noticed that in this figure the N-type regions 20 have no longer been drawn since the high P+ dose implanted to form the junctions leads to a complete compensation of the N ions implanted earlier. In this figure, the reference numeral 14' furthermore indicates the remaining well portions of the well regions 14. These portions 14' thus in practice define wells which completely surround the source and drain regions 24 of the P-channel transistor; in said portions 14 the concentration of the doping agent of the N well substrate region 3 is partially compensated, thus reducing the intensity of the maximum electric field peak in the P-channel transistor and raising the value of its breakdown voltage.

Figure 6:
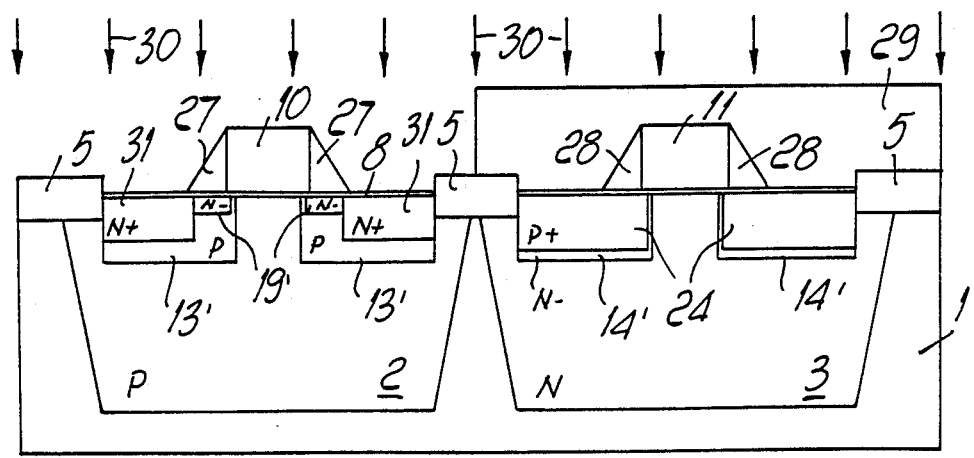

Then, according to the invention, after removing the mask 22, silicon oxide sidewall spacer structures are formed in a conventional manner to the side edges of the gate regions, as indicated by the reference numeral 27 for the N-channel transistor and by the reference numeral 28 for the P-channel transistor and as illustrated in FIG. 6. Consequently the surface of the substrate is again masked to implant the N+ junctions. A resist mask, indicated by the reference numeral 29 in FIG. 6, is then deposited in a conventional manner and covers the regions to be shielded from implantation, and in particular the regions comprising the P-channel transistors. Then the N+ implanting is performed, as indicated in FIG. 6 by the arrows 30. This implanting leads N+-type source/drain regions 31 to the sides of the spacer structures 27. Said regions 31, defining the source and drain regions of the N-channel transistor, extend completely inside the regions 13, which thus comprises well portions, indicated in FIG. 6 by the reference numeral 13', which completely surround the source and drain regions of the N-channel transistor. Due to the presence of the spacers 27, surface portions 19' of the LDD implanting remain to the sides of the source and drain regions 31, but are still comprised within the well portions 13'. The N-channel transistor consequently has P-type well portions which surround the source and drain regions and provides protection against punch-through in the N transistor, while the surface portions 19' allow to increase the breakdown voltage of the N-channel transistors according to the conventional LDD method.

The process ends in a conventional manner by forming the contacts and the interconnection lines, with the further final steps for manufacturing integrated circuits in CMOS technology.

Figure 3:
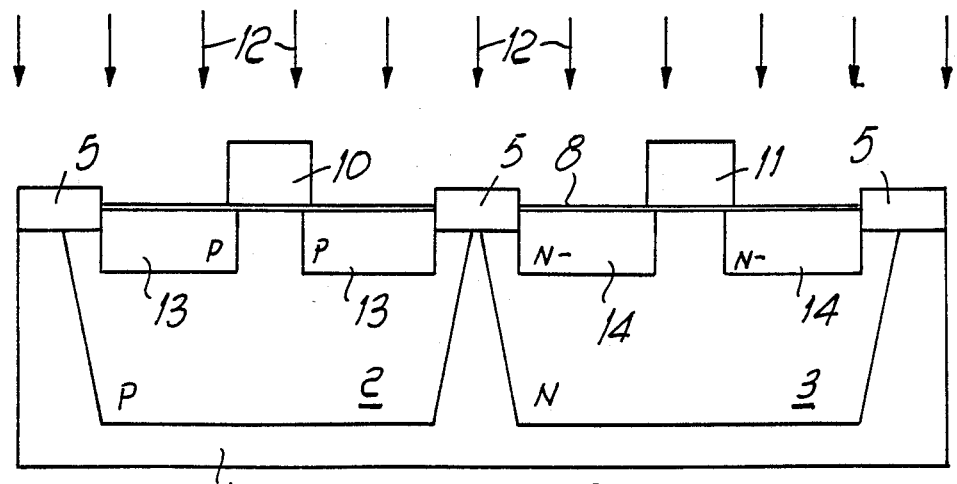

As can be seen from the previous description, the invention fully achieves the intended aims. In fact, by providing the P-type well surrounding the N+ junction of the N-channel transistor, a protection against the punch-through is provided, while the partial compensation of the concentration of the doping agent in the well portions 14' surrounding the source and drain regions of the P-channel transistors protects this type of transistors against breakdown. It should be noted that these regions are obtained by means of light P implanting on the entire substrate, as shown in FIG. 3, without using additional masks (blanket implant). In particular, the fact is stressed that in order to provide the protection regions, it is necessary to choose the dose of implanted doping agent P and the subsequent thermal treatment method, in order to form the well portions 13' which encloses the entire N+ junction of the N-channel transistor, while simultaneously ensuring that the implanted dose is low enough to only partially compensate the doping of the substrate region 3 without introducing scarcely doped P regions around the P+ junction, thus avoiding the forming of regions with greater resistance. For example, according to a process studied by the applicant, by providing a light P implanting with boron with an implanting dose of approximately $1 \times 10^{12}$ at 100 KeV followed by a thermal process at 900° C. for one hour, thus providing LDD regions in the N-channel transistor, an increase of approximately 1.5 V of the breakdown voltage is achieved in the P-channel transistor with a gate length of 1.0 μm, while there is no significant worsening of its resistance to punch-through.

In particular it has been noticed that in the indicated conditions, without using additional masks with respect to the conventional CMOS process, it is possible to provide the LDD regions only on the N-channel transistors, while the breakdown voltage of the P-channel transistors can be controlled by compensating the doping agent of the N substrate region 3 without introducing further serial resistances on these transistors, which already have a reduced gain due to the low mobility of the holes. It should be furthermore noted that the N dose of LDD implanted in the P-channel transistors is completely compensated by the high P+ dose implanted to form the junctions.

Naturally the process may be executed in a specular manner, so as to increase the breakdown voltage on the P-channel transistor by using LDD regions and, in the N-channel transistor, by providing a well with a partial compensation of the doping agent of the region which accommodates said N-channel transistor. In order to implement the above, it is sufficient to initially execute a light N implanting, instead of the P implanting illustrated in FIG. 3, so as to generate N+ doped regions inside the substrate region 3 and regions with a partial compensation of the P doping agent inside the substrate region 2. Then, instead of the N implanting of FIG. 4, a P implanting is performed to provide the LDD regions for the P-channel transistor. This specular process then provides the implanting of the P+ and N+ junctions in reverse order with respect to the sequence shown in FIG. 5, i.e. first of the N source and drain regions of the N-channel transistor are implanted laterally to the gate region of said transistor and then, after providing the spacer structures, of the P+ source and drain regions of the P-channel transistor are implanted in the region comprised between the insulations and the spacer structures, thus delimiting less doped surface LDD regions.

With this version of the process an increase of approximately 1 volt in the breakdown voltage of the junction has been noticed in N-channel transistors with a gate length of 0.8 microns, with no significant worsening of its resistance to punch-through, thus obtaining a 10% improvement with respect to the values of 10-12 volts which can be manufactured obtained using the conventional process. In this case the phosphorus dose implanted in the step illustrated in FIG. 3 is of approximately $1\times10^{12}$cm$^{-2}$ at 120 Kev, producing anti-punch-through wells of the halo type on the P+ junctions of the P-channel transistor.

As can be seen, the invention thus allows a marked improvement of the electric characteristics, without requiring additional masking steps with respect to the conventional process, and therefore with substantially comparable manufacturing costs. Furthermore, the worsening of the electric characteristics due to the presence of resistances in series to the source and drain regions is limited to only one of the two transistors, thus obtaining an improvement with respect to the known LDD process.

The invention thus conceived is susceptible to numerous modifications and variations, all of which are within the scope of the inventive concept. In particular the fact is stressed that though the described embodiment is applied to a structure having two drains or wells, a P-type one and an N-type one, both accommodating a respective transistor of a CMOS device, the same process can also be applied to N-well or P-well structures. The described process can furthermore be applied to the production of CMOS devices regardless of the method for defining the active areas and of the method for manufacturing the insulation, regardless of the material used to provide the gate regions (in particular with gates made of polycrystalline silicon, silicide or by superimposing polycrystalline silicon and silicide, etc.), provided that the thickness of the gate allows the self-alignment of the ion implantings which are forming the punch-through protection regions. The process is furthermore independent from the material in which the spacer structures are provided.

All the details may furthermore be replaced with other technically equivalent ones.

I claim:

1. In a body of semiconductor material defining at least one first substrate region of first conductivity type and a second substrate region of second conductivity type, a method for manufacturing CMOS integrated devices, comprising the steps of:
   forming a first gate on said first substrate region and second gate on said second substrate region,
   forming first heavily doped well regions of said first conductivity type in said first substrate regions adjacent to said first gate,
   forming first heavily doped source/drain regions of said second conductivity type in said first heavily doped well regions,
   forming second lightly doped well regions of said second conductivity type in said second substrate regions adjacent to said second gate,
   forming second heavily doped source/drain regions of said first conductivity type in said second lightly doped well regions.

2. A method according to claim 1, wherein said first heavily doped well regions of said first conductivity type in said first substrate regions and said second lightly doped well regions of said second conductivity type in said second substrate regions are formed simultaneously.

3. The method of claim 1, wherein, before forming said first heavily doped source/drain regions of said second conductivity type, lightly doped surface regions of said second conductivity type are formed in said first heavily doped well regions adjacent to said first gate, and oxide sidewall spacers are formed along side edges of said first gate, with said first heavily doped source/drain regions being formed adjacent to said lightly doped surface regions.

4. In a body of semiconductor material defining at least one first substrate region of first conductivity type and a second substrate region of second conductivity type, a method for manufacturing CMOS integrated devices, comprising the steps of:
   forming a first gate on said first substrate region and second gate on said second substrate region,
   light blanket implant of impurities of the first conductivity type to form first heavily doped well regions of the first conductivity type in said first substrate region adjacent to said first gate and second lightly doped well regions of the second conductivity type in said second substrate region adjacent to said second gate,
   selective introduction of impurities of the first type in said second lightly doped well regions to form heavily doped source/drain regions of the first conductivity type surrounded by lightly doped well portions of the second conductivity type in said second substrate regions of said second conductivity type,
   selective introduction of impurities of the second type in said first heavily doped well regions to form heavily doped source/drain regions of the second conductivity type surrounded by heavily doped well portions of the first conductivity type in said first substrate regions of said first conductivity type.

5. In a body of semiconductor material defining at least one first substrate region of first conductivity type and a second substrate region of second conductivity type, a method for manufacturing CMOS integrated devices, comprising the steps of:
   forming a first gate on said first substrate region and second gate on said second substrate region,
   light blanket implant of impurities of the first conductivity type to form first heavily doped well regions of the first conductivity type in said first substrate region adjacent to said first gate and second lightly doped well regions of the second conductivity type in said second substrate region adjacent to said second gate,
   blanket implant of impurities of the second conductivity type to form lightly doped surface regions of the second conductivity type in said first heavily doped well regions and intermediate heavily doped surface regions of the second conductivity type in said second lightly doped well regions,
   selective introduction of impurities of the first type in said second lightly doped well regions to compensate said intermediate heavily doped surface regions and to form heavily doped source/drain regions of the first conductivity type surrounded by lightly doped well portions of the second conductivity type in said second substrate regions of said second conductivity type,
   forming oxide sidewall spacers along side edges of said first and second gates,
   selective introduction of impurities of the second type in said first heavily doped well regions adjacent to said sidewall spacers of said first gate to form heavily doped source/drain regions of the second conductivity/type adjacent to lightly doped surface portions of the second conductivity type and downwardly surrounded by heavily doped well portions of the first conductivity type in said first substrate regions of said first conductivity type.

6. A method according to claim 5, wherein said first conductivity type is the P-type and said second conductivity type is the N-type.

7. A method according to claim 5, wherein said first conductivity type is the N-type and said second conductivity type is the P-type.

* * * * *